(12) United States Patent
Lee et al.

(10) Patent No.: US 12,439,512 B2
(45) Date of Patent: Oct. 7, 2025

(54) PRINTED CIRCUIT BOARD

(71) Applicant: SAMSUNG ELECTRO-MECHANICS CO., LTD., Suwon-si (KR)

(72) Inventors: Jin Uk Lee, Suwon-si (KR); Sangik Cho, Suwon-si (KR); Chi Won Hwang, Suwon-si (KR); Eun Sun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 227 days.

(21) Appl. No.: 17/469,147

(22) Filed: Sep. 8, 2021

(65) Prior Publication Data
US 2022/0322525 A1 Oct. 6, 2022

(30) Foreign Application Priority Data
Mar. 31, 2021 (KR) .......................... 10-2021-0042050

(51) Int. Cl.
H05K 1/02 (2006.01)
H05K 1/05 (2006.01)
H05K 1/11 (2006.01)

(52) U.S. Cl.
CPC .......... *H05K 1/0298* (2013.01); *H05K 1/053* (2013.01); *H05K 1/111* (2013.01); *H05K 1/115* (2013.01); *H05K 2201/09036* (2013.01)

(58) Field of Classification Search
CPC .................. H05K 1/0298; H05K 1/053; H05K 2201/09036; H05K 1/111; H05K 3/007;
(Continued)

(56) References Cited

U.S. PATENT DOCUMENTS 8,217,278 B2 * 7/2012 Yu .......................... H05K 3/465
174/262
8,238,114 B2 * 8/2012 Niki ..................... H05K 3/4682
361/767
(Continued)

FOREIGN PATENT DOCUMENTS

CN 103635035 A 3/2014
CN 107910315 A 4/2018
(Continued)

OTHER PUBLICATIONS

Office Action dated Jan. 27, 2025 issued in the corresponding Chinese Patent Application No. 202111431250.7 with English translation.
(Continued)

*Primary Examiner* — Ishwarbhai B Patel
(74) *Attorney, Agent, or Firm* — Morgan Lewis & Bockius LLP

(57) ABSTRACT

A printed circuit board includes a first insulating layer, a first conductor-pattern layer disposed on one surface of the first insulating layer, a first recess formed in the other surface of the first insulating layer opposing one surface of the first insulating layer, a second conductor-pattern layer disposed in the first recess, and a first metal post penetrating the first insulating layer, connecting the first and second conductor-pattern layers to each other, and having one end exposed to a bottom surface of the first recess, wherein the second conductor-pattern layer includes a seed layer disposed on at least a portion of each of a surface of one end of the first metal post exposed to the bottom surface of the first recess and an internal surface of the first recess including the bottom surface of the first recess, and a plating layer disposed on the seed layer to fill at least a portion of the first recess.

18 Claims, 12 Drawing Sheets

(58) Field of Classification Search
CPC ......... H05K 2201/09563; H05K 1/115; H05K 3/188; H05K 3/421; H05K 3/4007; H05K 1/144; H05K 1/02; H05K 24/13
See application file for complete search history.

(56) References Cited

U.S. PATENT DOCUMENTS

| | | | | |
|---|---|---|---|---|
| 9,307,651 | B2* | 4/2016 | Chen | H05K 3/045 |
| 10,141,224 | B2* | 11/2018 | Hu | H01L 21/76879 |
| 2009/0108455 | A1* | 4/2009 | Gurumurthy | H01L 21/76843 |
| | | | | 257/E23.141 |
| 2011/0139494 | A1* | 6/2011 | Yu | H05K 3/107 |
| | | | | 174/255 |
| 2011/0147342 | A1* | 6/2011 | Chiang | H05K 1/05 |
| | | | | 204/192.15 |
| 2011/0247860 | A1* | 10/2011 | Yoshioka | H05K 3/184 |
| | | | | 174/250 |
| 2012/0008295 | A1 | 1/2012 | Ouchi et al. | |
| 2013/0008705 | A1* | 1/2013 | Tseng | H01L 21/4857 |
| | | | | 29/829 |
| 2014/0060902 | A1 | 3/2014 | Hu | |
| 2014/0332255 | A1 | 11/2014 | Yoo et al. | |
| 2015/0008021 | A1 | 1/2015 | Ishida et al. | |
| 2017/0127517 | A1* | 5/2017 | Ishihara | H01L 23/5389 |
| 2017/0317017 | A1 | 11/2017 | Ishihara et al. | |
| 2018/0096889 | A1 | 4/2018 | Hu et al. | |
| 2019/0254162 | A1* | 8/2019 | Mino | H05K 3/1291 |
| 2020/0294915 | A1* | 9/2020 | Chu | H01L 23/5386 |

FOREIGN PATENT DOCUMENTS

| | | |
|---|---|---|
| JP | 2005-317901 A | 11/2005 |
| JP | 2011-249483 A | 12/2011 |
| JP | 2017-201674 A | 11/2017 |
| JP | 2019-080039 A | 5/2019 |
| KR | 10-2014-0044033 A | 4/2014 |
| KR | 10-2017-0135438 A | 12/2017 |

OTHER PUBLICATIONS

Korean Office Action dated Feb. 25, 2025 issued in Korean Patent Application No. 10-2021-0042050 (with English translation).

* cited by examiner

PRINTED CIRCUIT BOARD

CROSS-REFERENCE TO RELATED APPLICATION(S)

This application claims the benefit of priority to Korean Patent Application No. 10-2021-0042050 filed on Mar. 31, 2021 in the Korean Intellectual Property Office, the disclosure of which is incorporated herein by reference in its entirety.

TECHNICAL FIELD

The present disclosure relates to a printed circuit board.

BACKGROUND

As electronic devices in the field of information technology (IT), including mobile phones, have been designed to have a reduced thickness and size and to have higher performance, it has also been necessary to reduce a thickness and size of a pattern of printed circuit boards on which electronic components such as an integrated circuit (IC), and the like, are mounted, to correspond to such technical demands.

In the case of a general printed circuit board, a conductor-pattern layer may be patterned to protrude from one surface of an insulating layer, and the conductor-pattern layer may go through at least a portion of subsequent processes while being externally exposed. Accordingly, the conductor-pattern layer may have issues such as pattern loss, pattern lifting, collapsing and peeling during a process.

Also, in the case of a general printed circuit board, in forming a via and a conductor-pattern layer, an unavoidable process error may occur in a process of forming a via hole and a process of forming an opening in a plating resist. Thus, the process error may need to be reflected, and accordingly, there may be limitations in reducing a pattern line width of the conductor-pattern layer, a pitch between patterns, and a space between patterns.

SUMMARY

An aspect of the present disclosure is to provide a printed circuit board which may reduce a line width of a pattern of a conductor-pattern layer, a pitch between patterns, and a space between patterns.

Also, another aspect of the present disclosure is to provide a printed circuit board which may prevent damage and peeling of a conductor-pattern layer during a process.

An aspect of the present disclosure is to provide a printed circuit board which, by forming a recess in an insulating layer and a conductor-pattern layer in the recess, may prevent damage and peeling of the conductor-pattern layer even when a line width, a pitch, and a space of the conductor-pattern layer are reduced.

For example, according to an aspect of the present disclosure, a printed circuit board includes a first insulating layer, a first conductor-pattern layer disposed on one surface of the first insulating layer, a first recess formed in the other surface of the first insulating layer opposing one surface of the first insulating layer, a second conductor-pattern layer disposed in the first recess, and a first metal post penetrating the first insulating layer, connecting the first and second conductor-pattern layers to each other, and having one end exposed to a bottom surface of the first recess, wherein the second conductor-pattern layer includes a seed layer disposed on at least a portion of each of a surface of one end of the first metal post exposed to the bottom surface of the first recess and an internal surface of the first recess including the bottom surface of the first recess, and a plating layer disposed on the seed layer to fill at least a portion of the first recess.

According to another aspect of the present disclosure, a printed circuit board includes a first insulating layer; a first conductor-pattern layer disposed on one surface of the first insulating layer and including a first pad; a recess formed in the other surface of the first insulating layer opposing one surface of the first insulating layer; a second conductor-pattern layer disposed in the recess and including a second pad; and a metal post penetrating the first insulating layer, connecting the first and second pads to each other, and having one end exposed to a bottom surface of the recess, wherein a diameter of the metal post is greater than a diameter of each of the first and second pads.

According to another aspect of the present disclosure, a printed circuit board includes a first insulating layer; a first conductor-pattern layer disposed on a first surface of the first insulating layer; a first recess formed in a second surface of the first insulating layer opposing the first surface of the first insulating layer; a second conductor-pattern layer disposed in the first recess; and a first metal post penetrating the first insulating layer, connecting the first and second conductor-pattern layers to each other, wherein one end of the first metal post protrudes from a bottom surface of the first recess.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
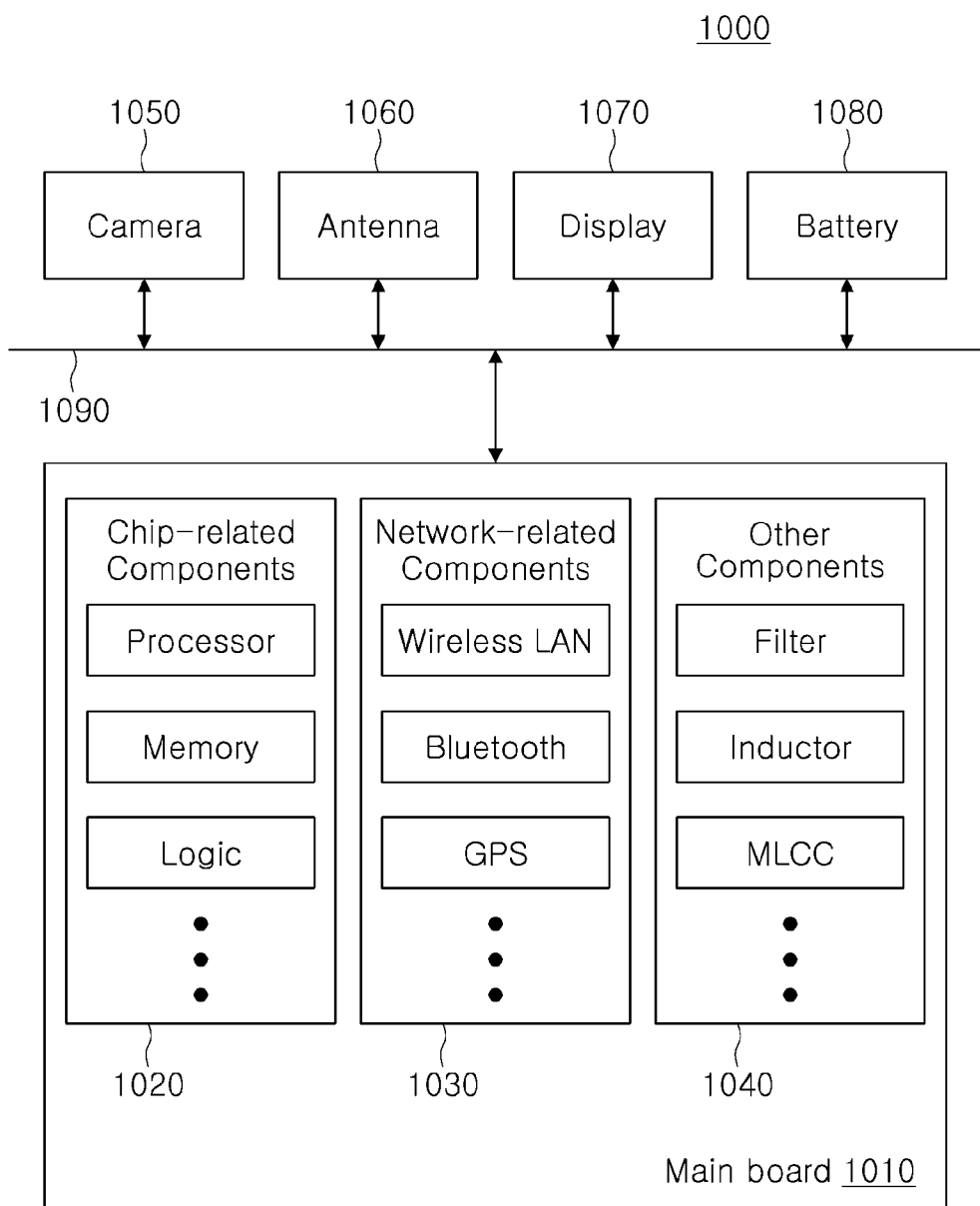
FIG. 1 is a block diagram illustrating an example of an electronic device system.

Hereinafter, embodiments of the present disclosure will be described as follows with reference to the attached drawings. The shapes and sizes of elements in the drawings may be exaggerated or reduced for clearer description.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other. The chip related components 1020 may have a package form including the above-described chip or an electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include chip-component type passive components used for various other purposes, or the like. Also, other components 1040 may be combined with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, and a battery 1080. However, an example embodiment thereof is not limited thereto, and these other components may include an audio codec, a video codec, a power amplifier, a compass, an accelerometer, a gyroscope, a speaker, a mass storage unit (for example, a hard disk drive), a compact disk (CD) drive), a digital versatile disk (DVD) drive, or the like. In addition to the above examples, other components used for various purposes depending on a type of electronic device 1000, or the like, may be included.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
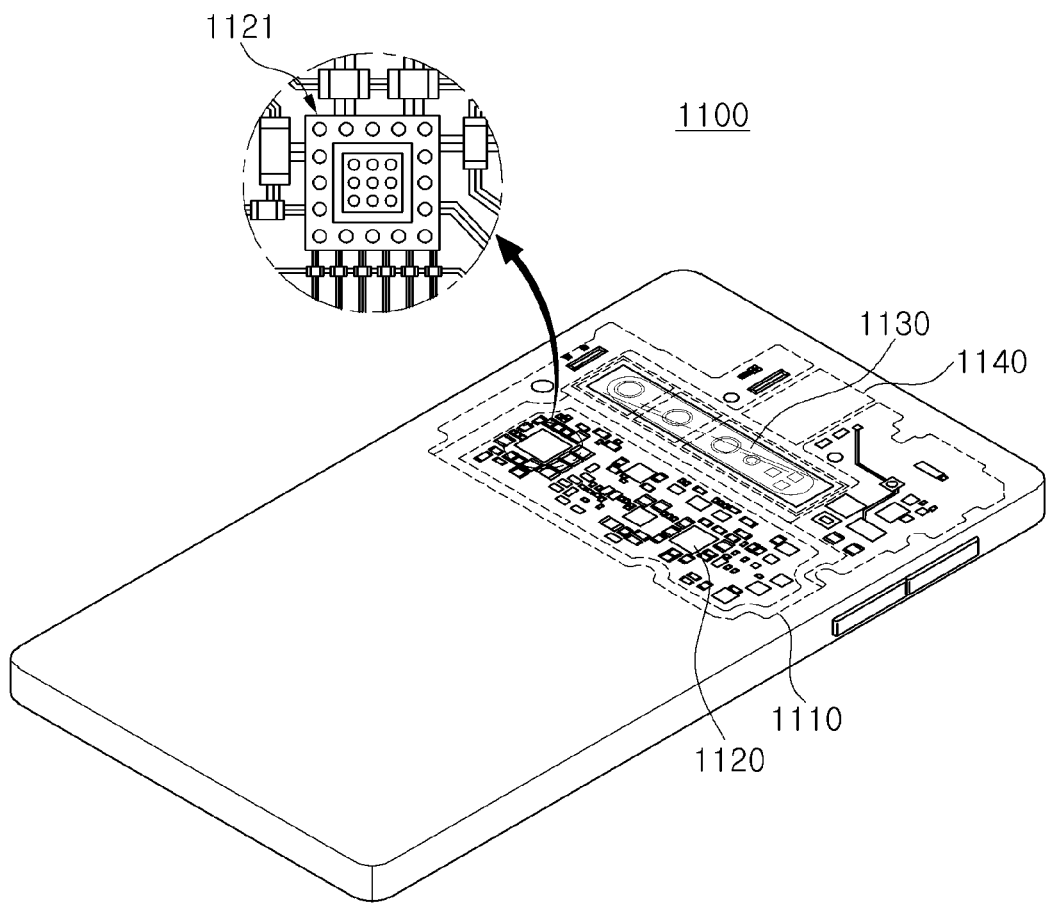
FIG. 2 is a perspective diagram illustrating an example of an electronic device.

FIG. 2 is a perspective diagram illustrating an example of an electronic device.

Referring to FIG. 2, the electronic device may be implemented by a smartphone 1100. A mainboard 1110 may be accommodated in a smartphone 1100, and various electronic components 1120 may be physically or electrically connected to the mainboard 1110. Other electronic components which may or may not be physically or electrically connected to the mainboard 1110, such as the camera module 1130 and/or the speaker 1140, may be accommodated therein. Some of the components 1120 may be the chip related components, such as a printed circuit board 1121, for example, but an example embodiment thereof is not limited thereto. In the printed circuit board 1121, electronic components may be embedded in a multilayer printed circuit board, but an example embodiment thereof is not limited thereto. The electronic device is not necessarily limited to the smartphone 1100, and may be other electronic devices as described above.

Figure 3:
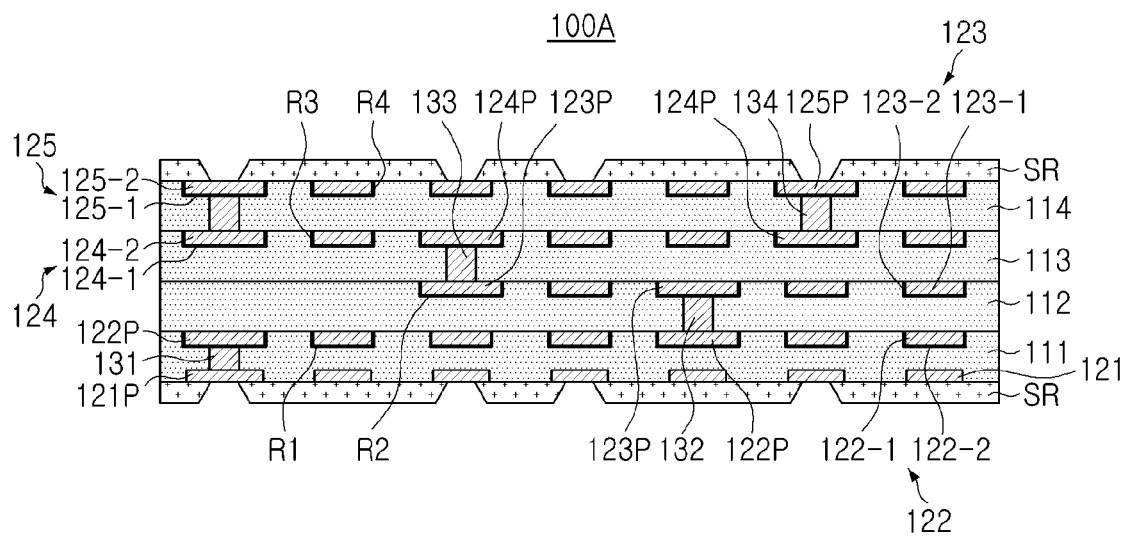
FIG. 3 is a cross-sectional diagram illustrating a printed circuit board according to an example embodiment of the present disclosure.

FIG. 3 is a cross-sectional diagram illustrating a printed circuit board according to an example embodiment.

Referring to the drawings, a printed circuit board 100A according to the first example embodiment may include a plurality of insulating layers 111, 112, 113, and 114, a plurality of conductor-pattern layers 121, 122, 123, 124 and 125, a plurality of metal posts 131, 132, 133, and 134, and a solder resist SR.

The plurality of insulating layers 111, 112, 113, and 114 may include a first insulating layer 111, a second insulating layer 112 disposed on the first insulating layer 111, a third insulating layer 113 disposed on the second insulating layer 112, and a fourth insulating layer 114 disposed on the third insulating layer 113. The plurality of insulating layers 111, 112, 113, and 114 may be formed using an insulating material. The insulating material may include one or more of a thermosetting insulating resin such as an epoxy resin, a thermoplastic resin such as polyimide, and a photocurable insulating resin such as an acrylate. Alternatively, the insulating material may include a reinforcing material such as an inorganic filler such as silica and/or glass fiber in the at least one insulating resin described above. For example, the plurality of insulating layers 111, 112, 113, and 114 may be formed of an insulating material such as Ajinomoto Built-up Film (ABF), prepreg (PPG), or photoimageable dielectric (PID). Each of the plurality of insulating layers 111, 112, 113, and 114 may be formed in different processes such that a boundary may be formed therebetween. However, since each of the plurality of insulating layers 111, 112, 113, and 114 is formed using a single insulating material, no boundaries dividing layers may be formed in each of the plurality of insulating layers 111, 112, 113, and 114. For example, since the first insulating layer 111 is formed using a single insulating material, a boundary dividing the layers may not be formed in the first insulating layer 111. Accordingly, a region of the first insulating layer 111 in which a first metal post 131 is disposed and a region of the first insulating layer 111 in which a second conductor-pattern layer 122 is disposed may be integrated with each other and boundaries may not be formed therebetween.

The plurality of conductor-pattern layers 121, 122, 123, 124, and 125 may include a first conductor-pattern layer 121 embedded in one surface (a lower surface in the direction in FIG. 3), a second conductor-pattern layer 122 embedded in the other surface (an upper surface in the direction in FIG. 3) of the first insulating layer 111, a third conductor-pattern layer 123 embedded in the other surface (an upper surface in the direction in FIG. 3) of the second insulating layer 112, a fourth conductor-pattern layer 124 embedded in the other surface (an upper surface in the direction in FIG. 3) of the third insulating layer 113, and a fifth conductor-pattern layer 125 embedded in the other surface (an upper surface in the direction in FIG. 3) of the fourth insulating layer 114. The plurality of metal posts 131, 132, 133 and 134 may include a first metal post 131, a second metal post 132 disposed on or above the first metal post 131, a third metal post 133 disposed on or above the second metal post 132, and a fourth metal post 134 disposed on or above the third metal post 133.

The first conductor-pattern layer 121 may be disposed on one surface of the first insulating layer 111 (the lower surface of the first insulating layer 111 in the direction in FIG. 3; referred to as a "first surface"). In the example embodiment, the first conductor-pattern layer 121 may be embedded in one surface of the first insulating layer 111, and the one surface may be exposed as one surface of the first insulating layer 111. Accordingly, the first conductor-pattern layer 121 may be an embedded pattern embedded in one surface of the first insulating layer 111. One surface of the first conductor-pattern layer 121 may be coplanar with one surface of the first insulating layer 111, but an example embodiment thereof is not limited thereto. As another example, one surface of the first conductor-pattern layer 121 may be disposed on a level higher than the one surface of the first insulating layer 111 in the direction in FIG. 3. The first conductor-pattern layer 121 may perform various functions according to a design. For example, the first conductor-pattern layer 121 may include a ground pattern, a power pattern, and a signal pattern. Each of these patterns may have a shape of a line, a shape of a plane, or a shape of a pad 121P. The first conductor-pattern layer 121 may include one or more elements selected from a group consisting of copper (Cu), titanium (Ti), chromium (Cr), nickel (Ni), molybdenum (Mo), silver (Ag), gold (Au), palladium (Pd), platinum (Pt), and tin (Sn). The cross-sectional shape of the first pad 121P of the first conductor-pattern layer 121 may be formed as a circular shape, a polygonal shape including a triangular shape, a polygonal shape in which vertices are rounded, and the like.

The second conductor-pattern layer 122 may be disposed in the first recess R1 formed on the other surface (the upper surface of the first insulating layer 111 in the direction in FIG. 3; referred to as a "second surface") of the first insulating layer 111. The third conductor-pattern layer 123 may be disposed in the second recess R2 formed on the other surface (the upper surface of the second insulating layer 112 in the direction in FIG. 3) of the second insulating layer 112. The fourth conductor-pattern layer 124 may be disposed in the third recess R3 formed on the other surface (the upper surface of the third insulating layer 113 in the direction in FIG. 3) of the third insulating layer 113. The fifth conductor-pattern layer 125 may be disposed in the fourth recess R4 formed on the other surface (the upper surface of the fourth insulating layer 114 in the direction in FIG. 3) of the fourth insulating layer 114. The first metal post 131 may penetrate the first insulating layer 111 and may connect the first conductor-pattern layer 121 to the second conductor-pattern layer 122. The second metal post 132 may penetrate the second insulating layer 112 and may connect the second conductor-pattern layer 122 to the third conductor-pattern layer 123. The third metal post 133 may penetrate the third insulating layer 113 and may connect the third conductor-pattern layer 123 to the fourth conductor-pattern layer 124. The fourth metal post 134 may penetrate the fourth insulating layer 114 and may connect the fourth conductor-pattern layer 124 to the fifth conductor-pattern layer 125. Hereinafter, only the first recess R1 formed in the other surface of the first insulating layer 111, the second conductor-pattern layer 122 disposed in the first recess R1, a seed layer 122-1 and a plating layer 122-2 of the second conductor-pattern layer 122, and the first metal post 131 will be described for ease of description, and the descriptions of the first recess R1, the second conductor-pattern layer 122, the seed layer 122-1 and the plating layer 122-2 of the second conductor-pattern layer 122, and the first metal post 131 may also be applied to the second to fourth recesses R2, R3, and R4, the third to fifth conductor-pattern layers 123, 124, and 125, seed layers 123-1, 124-1, and 125-1 and plating layers 123-2, 124-2, and 125-2 of the third to fifth conductor-pattern layers 123, 124, and 125, respectively, and the second to fourth metal posts 132, 133, and 134.

The first recess R1 may be formed by patterning a non-penetrating groove that does not penetrate the first insulating layer 111 on the other surface (the upper surface of the first insulating layer 111 in the direction in FIG. 3) of the first insulating layer 111. The patterning process for forming the first recess R1 in the first insulating layer 111 may be implemented by laser processing, a plasma etching process using a mask formed of a resin material or a metal material, and a stamping process of stamping a material formed by reverse transcription of the pattern of the first recess R1 onto the first insulating layer 111.

The first metal post 131 may penetrate the first insulating layer 111, may connect the first and second conductor-pattern layers 121 and 122 to each other, and may have one end exposed to the bottom of the first recess R1. The first metal post 131 may be formed by forming the first conductor-pattern layer 121, laminating a plating resist, forming an opening corresponding to the first metal post 131 in the plating resist through a photolithography process, and filling the opening with a conductive material through plating. Thereafter, the plating resist may be removed, the first insulating layer 111 may be formed to cover the first conductor-pattern layer 111 on which the first metal post 131 is formed, the first recess R1 may be formed in the first insulating layer 111, and a depth of the first recess R1 may be adjusted to expose one end (an upper end of the first metal post 131 in the direction in FIG. 3) of the first metal post 131. Accordingly, one end of the first metal post 131 may be exposed to the bottom surface of the first recess R1. The first metal post 131 may be in contact with and connected to each of the first pad 121P of the first conductor-pattern layer 121 and the second pad 122P of the second conductor-pattern layer 122. The first metal post 131 may include one or more selected from a group consisting of copper (Cu), titanium (Ti), chromium (Cr), nickel (Ni), molybdenum (Mo), silver (Ag), gold (Au), palladium (Pd), platinum (Pt), and tin (Sn).

The first metal post 131 may be formed by electroplating using the first conductor-pattern layer 121 as a seed. Accordingly, the first metal post 131 may include only a single plating layer, but an example embodiment thereof is not limited thereto. As another example, the first metal post 131 may include two or more plating layers. The cross-sectional shape of the first metal post 131 may be formed as a circular shape, a polygonal shape including a triangular shape, a polygonal shape in which vertices are rounded, and the like.

The second conductor-pattern layer 122 may be disposed in the first recess R1 and may fill at least a portion of the first recess R1. The second conductor-pattern layer 122 may include the seed layer 122-1 disposed on at least a portion of a surface of one end of the first metal post 131 exposed to the bottom surface of the first recess R1 and internal surfaces (a bottom surface and an internal wall) of the first recess R1 including the bottom surface of the first recess R1, and a plating layer 122-2 disposed on the seed layer 122-1 to fill at least a portion of the first recess R1. The seed layer 122-1 of the second conductor-pattern layer 122 may be formed conformally along the upper surface of the first metal post 131 exposed to the bottom surface of the first recess R1 and the internal surface of the first recess R1. The seed layer 122-1 of the second conductor-pattern layer 122 may be continuously formed along the upper surface of the first metal post 131 exposed to the bottom surface of the first recess R1 and the internal surface of the first recess R1. The seed layer 122-1 of the second conductor-pattern layer 122 may be formed by electroless plating or vapor deposition such as sputtering, but an example embodiment thereof is not limited thereto. The seed layer 122-1 of the second conductor-pattern layer 122 may include one or more elements selected from a group consisting of copper (Cu), titanium (Ti), chromium (Cr), nickel (Ni), molybdenum (Mo), silver (Ag), gold (Au), palladium (Pd), platinum (Pt), and tin (Sn). The seed layer 122-1 of the second conductor-pattern layer 122 may include one or more layers including at least one of the aforementioned materials. The plating layer 122-2 of the second conductor-pattern layer 122 may be formed by electroplating using the seed layer 122-1 of the second conductor-pattern layer 122. The plating layer 122-2 of the second conductor-pattern layer 122 may include one or more elements selected from a group consisting of copper (Cu), titanium (Ti), chromium (Cr), nickel (Ni), molybdenum (Mo), silver (Ag), and gold (Au), palladium (Pd), platinum (Pt), and tin (Sn). The plating layer 122-2 of the second conductor-pattern layer 122 may include one or more layers including at least one of the aforementioned materials. The second conductor-pattern layer 122 may perform various functions according to a design. For example, the second conductor-pattern layer 122 may include a ground pattern, a power pattern, and a signal pattern. Each of these patterns may have a shape of a line, a shape of a plane, or a shape of a pad 122P. The cross-sectional shape of the second pad 122P of the second conductor-pattern layer 122 may be formed as a circular shape, a polygonal shape including a triangular shape, a polygonal shape in which vertices are rounded, and the like.

FIGS. 4 to 14 are cross-sectional diagrams illustrating an example of a process of manufacturing the printed circuit board in FIG. 3.

Figure 4:
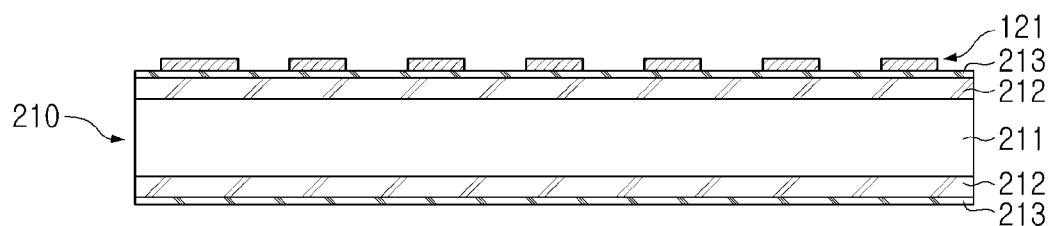
FIGS. 4 to 14 are cross-sectional diagrams illustrating an example of a process of manufacturing the printed circuit board illustrated in FIG. 3.

Referring to FIG. 4, a first conductor-pattern layer 121 may be formed on at least one surface of a carrier 210. The carrier 210 may include a support member 211, a first metal film 212 disposed on each of both surfaces of the support member 211, second metal film 213 disposed on each of the first metal films 212 disposed on both surfaces of the support member 211. The carrier 210 may be a general detachable core film, but an example embodiment thereof is not limited thereto. The support member 211 may be a member for securing rigidity of the carrier 210 and may be a prepreg, but an example embodiment thereof is not limited thereto. Each of the first and second metal films 212 and 213 may include one or more elements selected from a group consisting of copper (Cu), titanium (Ti), chromium (Cr), nickel (Ni), molybdenum (Mo), silver (Ag), gold (Au), and palladium (Pd), platinum (Pt), and tin (Sn). As a non-limiting example, each of the first and second metal films 212 and 213 may be a copper film formed of copper (Cu). As an example, although not limited thereto, each of the first and second metal films 212 and 213 may be a copper film formed of copper (Cu). The first conductor-pattern layer 121 may be formed by forming a plating resist on the second metal film 213 of the carrier 210, forming an opening in the plating resist by a photolithography process, and filling the opening of the plating resist with a conductor material using the second metal film 213 as a seed, and removing the plating resist.

Figure 5:
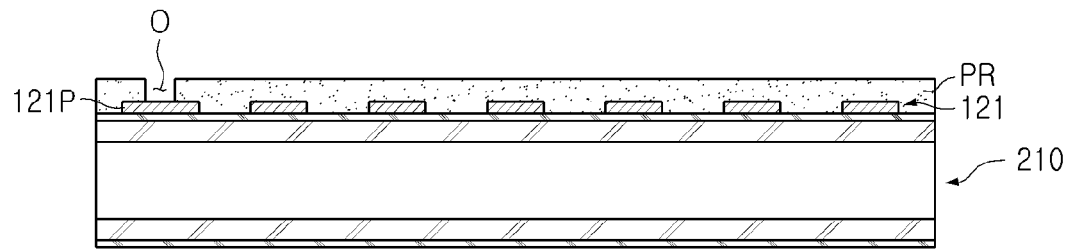

Referring to FIG. 5, a plating resist PR may be formed to cover the first conductor-pattern layer 121, and an opening O exposing the first pad 121P of the first conductor-pattern layer 121 may be formed. The plating resist PR may be formed on the carrier 210 using a general dry film material or by applying a liquid material. The opening O may be formed by a photolithography process when the plating resist PR is a photosensitive material, and when the plating resist PR is a thermosetting material, The opening O may be formed by a laser process, but an example embodiment thereof is not limited thereto.

Figure 6:
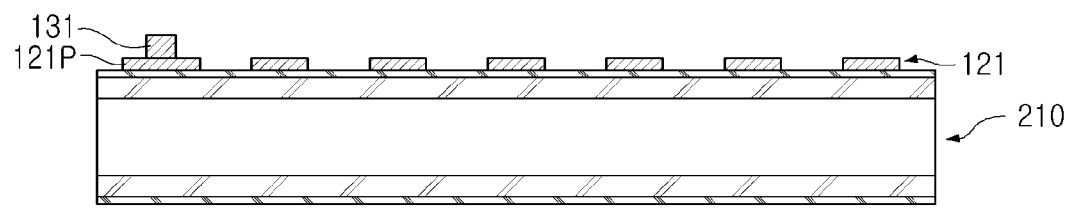

Referring to FIG. 6, the first metal post 131 may be formed by filling the opening O of the plating resist PR with a conductive material, and the plating resist PR may be removed. The first metal post 131 may be formed by electroplating.

Figure 7:
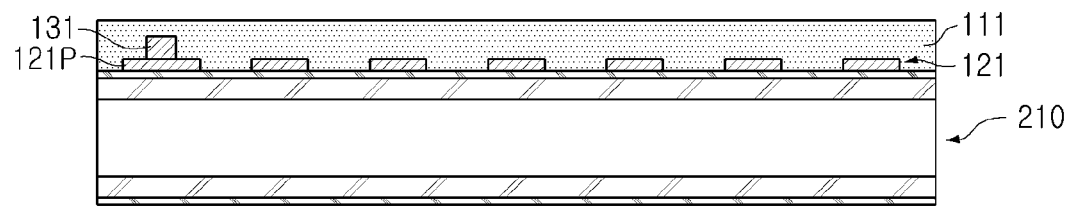

Referring to FIG. 7, a first insulating layer 111 may be formed on the carrier 210 to cover the first conductor-pattern layer 121 and the first metal post 131. The first insulating layer 111 may be formed using an insulating material. The insulating material may include at least one of a thermosetting insulating resin such as an epoxy resin, a thermoplastic resin such as polyimide, and a photocurable insulating resin such as an acrylate. Alternatively, the insulating material may include a reinforcing material such as an inorganic filler such as silica and/or glass fiber in the at least one insulating resin described above. For example, the first insulating layer 111 may be formed of an insulating material such as Ajinomoto Built-up Film (ABF), prepreg (PPG), or photoimageable dielectric (PID).

Figure 8:
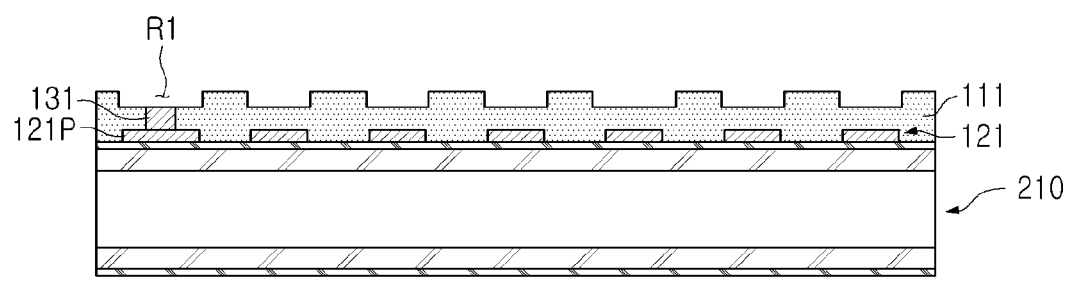

Referring to FIG. 8, the first recess R1 may be formed on the other surface (the upper surface of the first insulating layer 111 with reference to FIG. 8) of the first insulating layer 111. The first recess R1 may be formed by patterning a non-penetrating groove that does not penetrate the first insulating layer 111 on the other surface (the upper surface of the first insulating layer 111 in the direction in FIG. 8) of the first insulating layer 111. The patterning process for forming the first recess R1 in the first insulating layer 111 may be implemented by laser processing, a plasma etching process using a mask formed of a resin material or a metal material, and a stamping process of stamping a material formed by reverse transcription of the pattern of the first recess R1 onto the first insulating layer 111. A depth of the first recess R1 may be adjusted such that one end of the first metal post 131 may be exposed to the bottom surface of the first recess R1.

Figure 9:
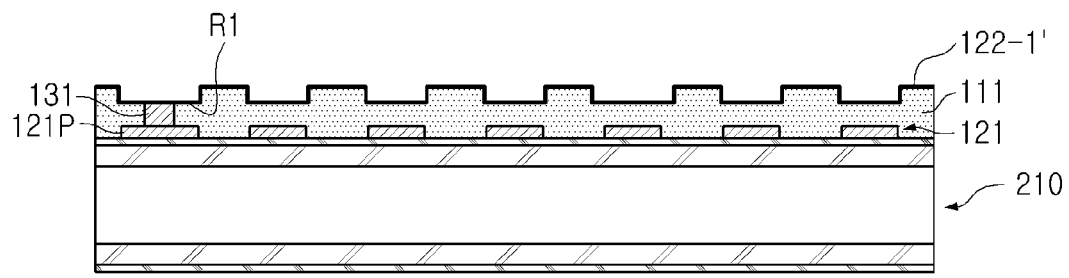

Referring to FIG. 9, a seed 122-1' including the internal surface of the first recess R1 may be formed on the entire surface of the first insulating layer 111. The seed 122-1' in this process may be configured to become the seed layer 122-1 of the second conductor-pattern layer 122 described above through a subsequent process. The seed 122-1' may be formed by electroless plating or vapor deposition such as sputtering, but an example embodiment thereof is not limited thereto. The seed 122-1' may include one or more selected from a group consisting of copper (Cu), titanium (Ti), chromium (Cr), nickel (Ni), molybdenum (Mo), silver (Ag), gold (Au), palladium (Pd), platinum (Pt), and tin (Sn). The seed 122-1' may be formed of one or more layers including at least one of the aforementioned materials.

Figure 10:
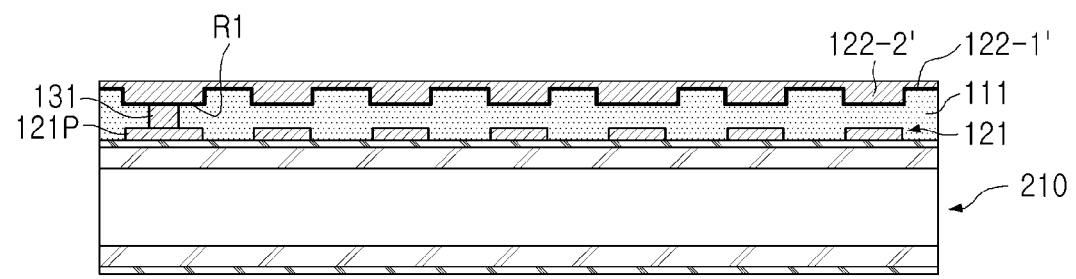

Referring to FIG. 10, a metal layer 122-2' filling the first recess R1 may be formed. The metal layer 122-2' in this process may be configured to become the plating layer 122-2 of the second conductor-pattern layer 122 described above through a subsequent process. The metal layer 122-2' may be formed by electroplating, but an example embodiment thereof is not limited thereto. The metal layer 122-2' may include one or more selected from a group consisting of copper (Cu), titanium (Ti), chromium (Cr), nickel (Ni), molybdenum (Mo), silver (Ag), gold (Au), palladium (Pd), platinum (Pt), and tin (Sn). The metal layer 122-2' may include one or more layers including at least one of the aforementioned materials.

Figure 11:
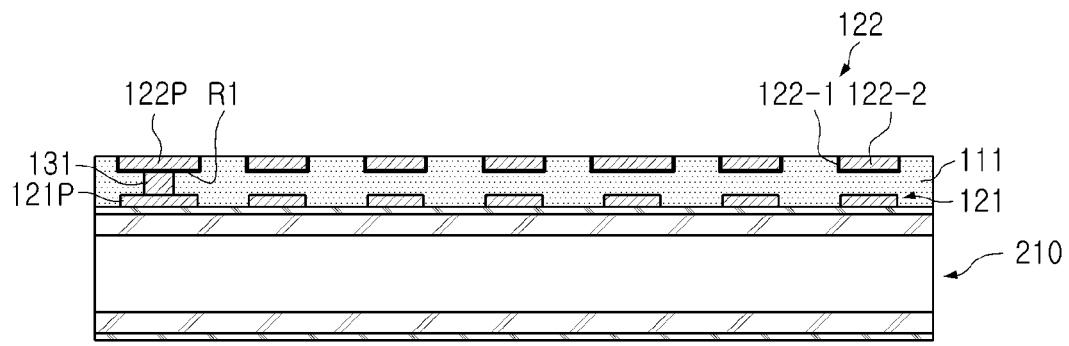

Referring to FIG. 11, the metal layer 122-2' and the seed 122-1' may be partially removed to expose the other surface (the upper surface of the first insulating layer 111 with reference to FIG. 11) of the first insulating layer 111. The removal process described above may be performed by at least one of chemical means (e.g., etching), chemical/mechanical means (e.g., CMP), or mechanical means (e.g., polishing). After this process, the second conductor-pattern layer 122 including the seed layer 122-1 and the plating layer 122-2 may be formed.

Figure 12:
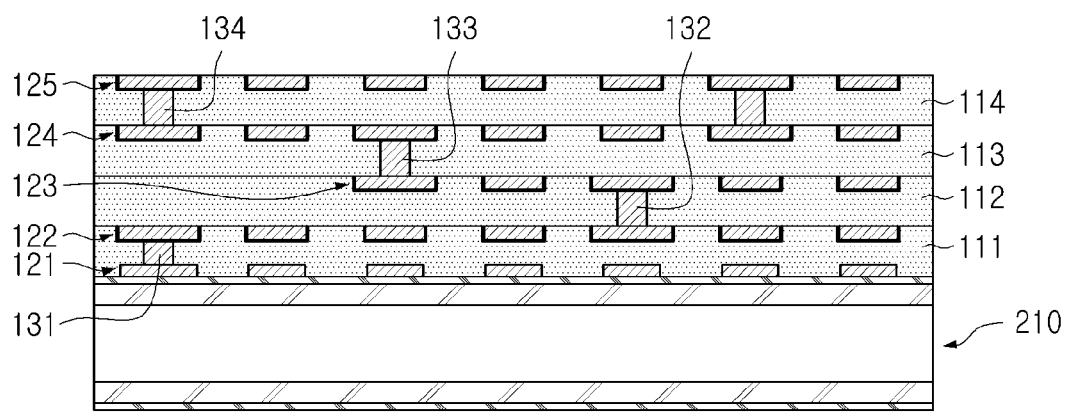

Referring to FIG. 12, second to fourth insulating layers 112, 113, and 114, third to fifth conductor-pattern layers 123, 124, and 125, and second to fourth metal posts 132, 133, and 134 may be formed. The second to fourth insulating layers 112, 113, and 114, the third to fifth conductor-pattern layers 123, 124, and 125, and the second to fourth metal posts 132, 133 and 134 may be formed by the process of forming the second conductor-pattern layer 122 described above.

Figure 13:
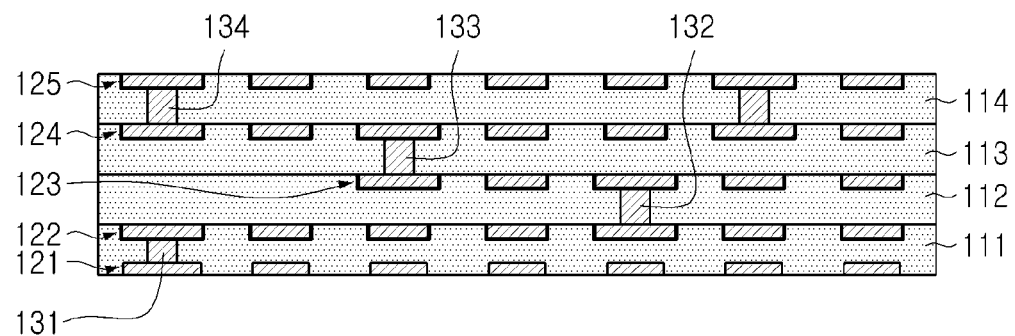

Referring to FIG. 13, the carrier 210 may be removed from one surface (the lower surface of the first insulating layer 111 with reference to FIG. 13) of the first insulating layer 111. When the carrier 210 is removed by separation in interfacial surfaces between the first metal film 212 and the second metal film 213 of the carrier 210, the support member 211 and the first metal film 212 of the carrier 210 may be preferentially removed from one surface of the first insulating layer 111, and the carrier 210 may be removed by removing the second metal film 213 remaining on one surface of the first insulating layer 111.

Figure 14:
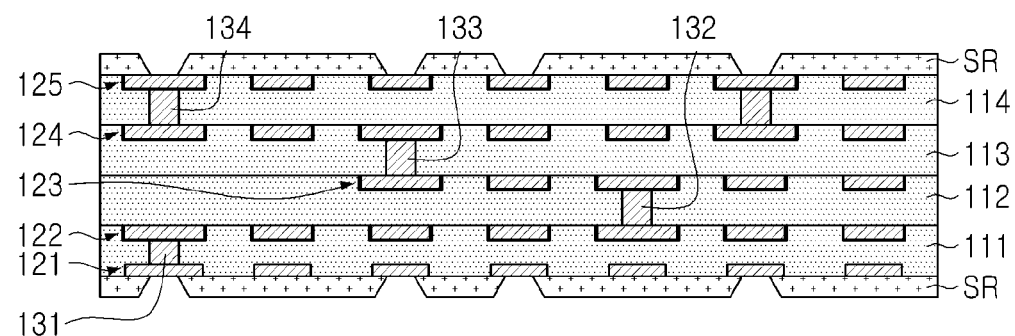

Referring to FIG. 14, the solder resist SR may be formed on each of one surface (the lower surface of the first insulating layer 111 with reference to FIG. 14) of the first insulating layer 111 and the other surface (the upper surface of the fourth insulating layer 114 with reference to FIG. 14) of the fourth insulating layer 114 (FIG. 14).

Accordingly, in the printed circuit board 100A according to the example embodiment, each of the second to fifth conductor-pattern layers 122, 123, 124, and 125 may have a reduced line width, a reduced pitch, and a reduced space. Also, in the printed circuit board 100A according to the example embodiment, each of the second to fifth conductor-pattern layers 122, 123, 124, and 125 may have a reduced thickness. Hereinafter, the above-described effect will be described by comparing a general printed circuit board with the printed circuit board 100A according to the example embodiment. In the description below, the names of the elements applied to the printed circuit board 100A according to the example embodiment may also be applied to the general printed circuit board, and reference numerals may not be provided to the elements applied to the general printed circuit boards to distinguish the elements applied to the example embodiment from the elements applied to the general printed circuit board.

As for the general printed circuit board, a first insulating layer and a second conductor-pattern layer may be formed through the process as below. First, a first conductor-pattern layer may be formed, and a first insulating layer may be formed. Thereafter, a first via hole for opening a first pad of the first conductor-pattern layer may be formed in the first insulating layer with respect to the first conductor-pattern layer. A seed layer may be formed on the surface of the first insulating layer including the internal wall of the first via hole. A plating resist may be formed on the upper surface of the first insulating layer on which the seed layer is formed. An opening may be formed in the plating resist corresponding to the position in which the second conductor-pattern layer is formed through a photolithography process. The plating layer may be formed in the opening of the plating resist by electroplating. The second conductor-pattern layer may be formed by removing the plating resist and removing a region of the seed layer in which the plating layer is not formed. In the second conductor-pattern layer of a general printed circuit board formed through the above process, a lower surface may be in contact with the upper surface of the first insulating layer, and an upper surface and both side surfaces may be in contact with the second insulating layer formed in the first insulating layer, with reference to a cross-sectional surface. Thus, in the second conductor-pattern layer applied to a general printed circuit board may go through the process of forming a plating resist to the process of removing a seed layer in a state in which only one of the four surfaces may be in contact with the first insulating layer with reference to a cross-sectional surface. In this case, when the line width of the second conductor-pattern layer deceases, a contact area of the second conductor-pattern layer in contact with the upper surface of the first insulating layer may be reduced, such that the second conductor-pattern layer may be damaged and peeled by external stress applied to the process of forming a plating resist to the process of removing a seed layer. However, in the example embodiment, with reference to the cross-sectional surface, the lower surface and two both side surfaces of the second conductor-pattern layer 122 may be in contact with the first insulating layer 111, and only the upper surface of the second conductor-pattern layer 122 may be exposed, such that a bonding force between the second conductor-pattern layer 122 and the first insulating layer 111 may increase as compared to the general printed circuit board described above. Thus, in the example embodiment, the second conductor-pattern layer 122 may be formed to have a reduced thickness.

As described above, a general printed circuit board may go through a process of forming a via hole and a process of forming an opening in a plating resist to form the second conductor-pattern layer. The process of forming a via hole and the process of forming an opening may be performed based on data derived by recognizing or calculating the position of the first pad of the first conductor-pattern layer embedded in the first insulating layer and the position of the first pad exposed through the via hole formed in the first insulating layer. However, due to unavoidable process errors occurring in each process, in a general printed circuit board, the second conductor-pattern layer may be inevitably formed in the position in which the process error in the process of forming a via hole and the process of forming an opening in the plating resist are cumulatively reflected. Accordingly, in a general printed circuit board, the above-described process error in designing a space and a pitch between patterns of the second conductor-pattern layer may need to be taken into account (tolerance-reflecting design). However, in the example embodiment, since the first recess R1 in which the second conductor-pattern layer 122 is disposed may be directly formed on the other surface of the first insulating layer 111, a process error in the process of forming an opening in the plating resist in at least the general printed circuit board described above may be removed. Accordingly, in the example embodiment, the second conductor-pattern layer 122 may be formed in a more accurate position as compared to a general printed circuit board. Accordingly, in the example embodiment, as compared to a general printed circuit board, a space between the patterns of the second conductor-pattern layer 122, a pitch between the patterns, and a line width of the pattern may be reduced.

In a modified example, at least one of the third to fifth conductor-pattern layers 123, 124, and 125 may be formed using a general AP, SAP, MSAP, and subtractive method. For example, the third conductor-pattern layer 123 may be formed to protrude on the upper surface of the second insulating layer 112. Accordingly, the second metal post 132 may have the same shape as that of the aforementioned first metal post 131, or may have a general via shape including a seed layer formed on an internal wall of a via hole and a plating layer filling the remaining via hole.

Figure 15:
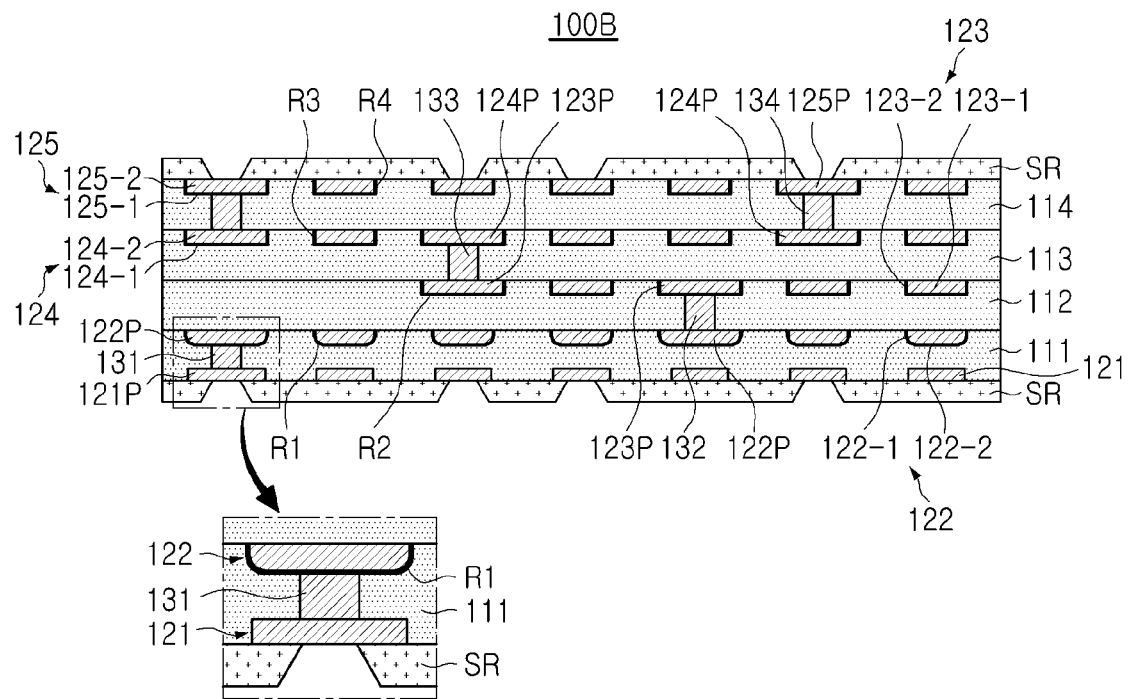
FIG. 15 is a cross-sectional diagram illustrating a printed circuit board according to a second example embodiment of the present disclosure.

FIG. 15 is a cross-sectional diagram illustrating a printed circuit board according to a second example embodiment.

Referring FIGS. 3 and 15, in the printed circuit board 100B according to the second example embodiment, shapes of the first recess R1 and the second conductor-pattern layer 122 may be different as compared to the printed circuit board 100A according to the first example embodiment. Therefore, in the example embodiment, only the first recess R1 and the second conductor-pattern layer 122, which may be different from the first example embodiment, will be described. The description in the first example embodiment may be applied to the other elements of the example embodiment.

Referring to FIG. 15, a cross-sectional area of a partial region of the second conductor-pattern layer 122 may be reduced in a direction from the other surface (the upper surface of the first insulating layer 111 with reference to FIG. 15) of the first insulating layer 111 toward one surface (the lower surface of the first insulating layer 111 with reference to FIG. 15) of the first insulating layer 111. In other words, a cross-sectional area of a partial region of the first recess R1 in which the second conductor-pattern layer 122 is disposed may be reduced in a direction from the other surface (the upper surface of the first insulating layer 111 with reference to FIG. 15) of the first insulating layer 111 toward one surface (the lower surface of the first insulating layer 111 with reference to FIG. 15) of the first insulating layer 111. The partial region of each of the first recess R1 and the second conductor-pattern layer 122 of which the cross-sectional area is reduced may be disposed more adjacent to the metal post 131 than the other region of each of the first recess R1 and the second conductor-pattern layer 122. For example, with reference to the direction in FIG. 15, the amount of decrease in the cross-sectional area in the downward direction of the lower region of the first recess R1 may be greater than the amount of decrease in the cross-sectional area in the downward direction of the upper region of the first recess R1. As another example, with reference to the direction in FIG. 15, the amount of decrease in the cross-sectional area of the first recess R1 in the downward direction may be substantially constant throughout the upper region and the lower region.

In the example embodiment, the first recess R1 may have the region having a reduced cross-sectional area, and the region having a reduced cross-sectional area may be disposed more adjacent to the first metal post 131 than the other region of the first recess R1, such that a plating defect of the second conductor-pattern layer 122 may be prevented. In other words, the internal wall of the first recess R1 may be inclined due to the reduced cross-sectional area, and due to the inclined region, the seed layer of the second conductor-pattern layer 122 may be formed reliably on the internal wall of the first recess R1 due to the inclined region. Accordingly, a plating defect in which the second conductor-pattern layer 122 is not formed in the first recess R1 may be reduced.

In FIG. 15, the region having a reduced cross-sectional area may be only formed in the first recess R1, but an example embodiment thereof is not limited thereto. The region having a reduced cross-sectional area may be formed in at least one of the second to fourth recesses R2, R3, and R4.

Figure 16:
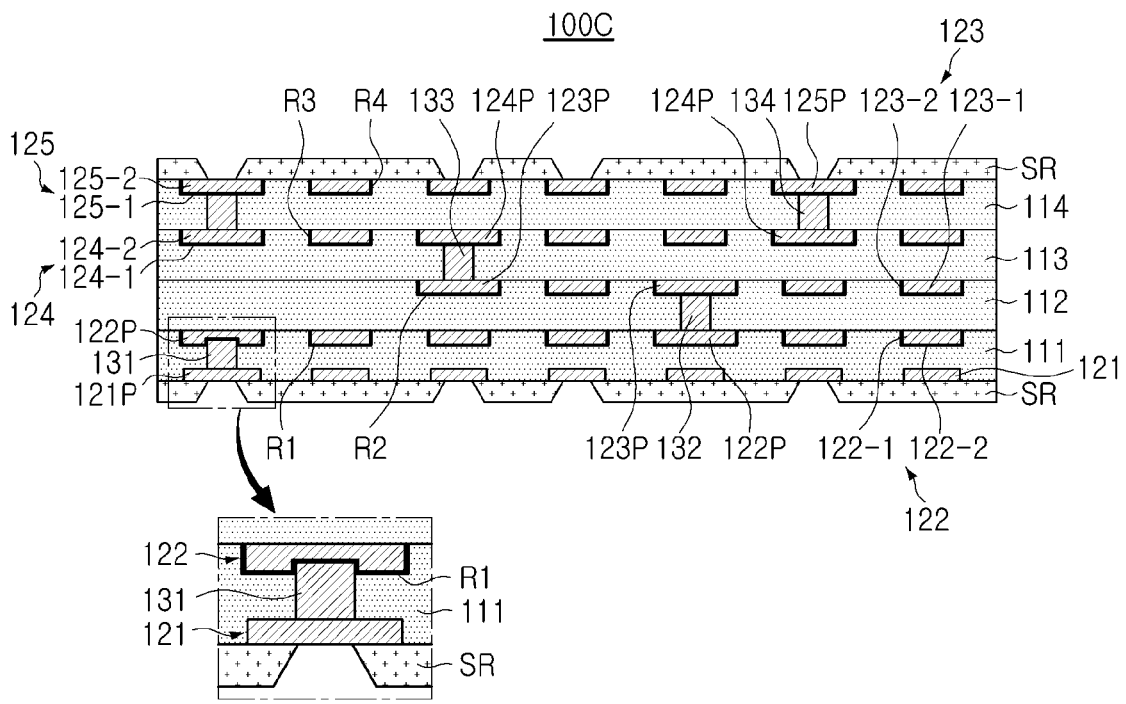
FIG. 16 is a cross-sectional diagram illustrating a printed circuit board according to a third example embodiment of the present disclosure.
Figure 17:
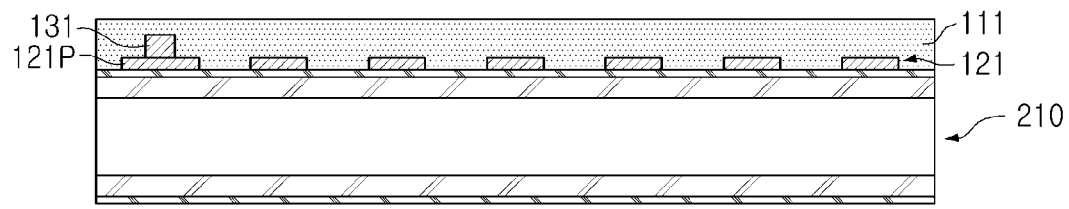
FIGS. 17 and 18 are cross-sectional diagrams illustrating a portion of a process of manufacturing the printed circuit board illustrated in FIG. 16.
Figure 18:
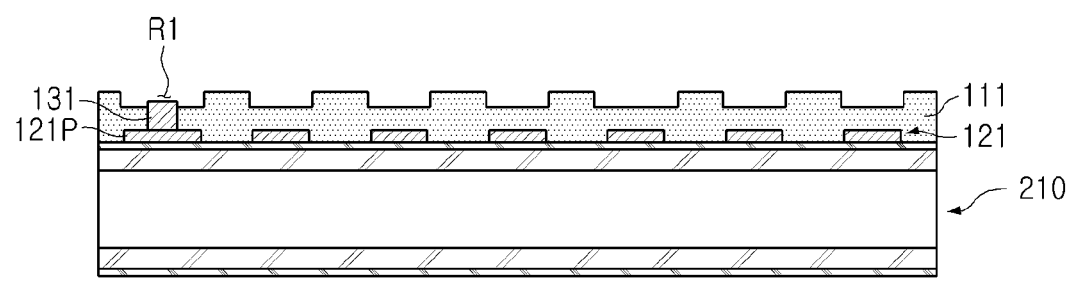

FIG. 16 is a cross-sectional diagram illustrating a printed circuit board according to a third example embodiment. FIGS. 17 and 18 are cross-sectional diagrams illustrating a portion of a process of manufacturing the printed circuit board illustrated in FIG. 16.

Referring to FIGS. 3 and 16, in a printed circuit board 100C according to the third example embodiment, the shape of the first metal post 131 may be different as compared to the printed circuit board 100A according to the first example embodiment. Therefore, in describing the example embodiment, only the first metal post 131 different from the metal post in the first example embodiment will be described. The description of the first example embodiment may be applied to the other elements of the example embodiment.

Referring to FIG. 16, one end (an upper region of the first metal post 131 with reference to FIG. 16) of the first metal post 131 may protrude from a bottom surface of the first recess R1. Also, a seed layer 122-1 of a second conductor-pattern layer 122 formed on an internal surface of the first recess R1 may be disposed on at least a portion of each of an upper surface of one end of the first metal post 131, a side surface of one end of the first metal post 131, and an internal surface of the first recess R1. For example, the seed layer 122-1 of the second conductor-pattern layer 122 may be configured as a conformal film to correspond to the shape of the surface formed by the upper surface of one end of the first metal post 131, the side surface of on end of the first metal post 131, and the internal surface of the first recess R1. Also, the seed layer 122-1 of the second conductor-pattern layer 122 may be continuously disposed along the upper surface of one end of the first metal post 131, the side surface of on end of the first metal post 131, and the internal surface of the first recess R1.

Referring to FIGS. 17 and 18 and FIGS. 4 to 14, in an example of the manufacturing process, the process of forming the first recess R1 may be different as compared to the example of the process of manufacturing the printed circuit board according to the first example embodiment described above. Therefore, in describing the example of the manufacturing process, only the process of forming the first recess R1 different from the manufacturing process of the first example embodiment will be described. The description in the manufacturing process of the first example embodiment will be applied to the other processes.

The processes described with reference to FIGS. 4 to 6 will be described.

Referring to FIG. 17, a first insulating layer 111 may be formed on the carrier 210 to cover the first conductor-pattern layer 121 and the first metal post 131. The first insulating layer 111 may be formed using an insulating material. The insulating material may include at least one of a thermosetting insulating resin such as an epoxy resin, a thermoplastic resin such as polyimide, and a photocurable insulating resin such as an acrylate. Alternatively, the insulating material may include a reinforcing material such as an inorganic filler such as silica and/or glass fiber in the at least one insulating resin described above. For example, the first insulating layer 111 may be formed using an insulating material such as Ajinomoto built-up film (ABF), prepreg (PPG), or photo-imageable dielectric (PID).

Referring to FIG. 18, a first recess R1 may be formed on the other surface (the upper surface of the first insulating layer 111 with reference to FIG. 18) of the first insulating layer 111. The first recess R1 may be formed by patterning a non-penetrating groove that does not penetrate the first insulating layer 111 on the other surface (the upper surface of the first insulating layer 111 in the direction in FIG. 18) of the first insulating layer 111. The patterning process for forming the first recess R1 in the first insulating layer 111 may be implemented by at least one of laser processing, a plasma etching process using a mask formed of a resin material or a metal material, and a stamping process of stamping a material formed by reverse transcription of the pattern of the first recess R1 onto the first insulating layer 111. In the manufacturing process of the example embodiment, a processing depth of the first recess R1 may be adjusted such that one end of the first metal post 131 may protrude from the bottom surface of the first recess R1.

Thereafter, the processes described with reference to FIGS. 9 to 14 are performed to manufacture the printed circuit board 100C according to the example embodiment.

In the example embodiment, since one end of the first metal post 131 protrudes from the bottom surface of the first recess R1, one end of the first metal post 131 may be inserted into the second conductor-pattern layer 122. Accordingly, electrical and physical coupling reliability between the first metal post 131 and the second conductor-pattern layer 122 may improve.

In FIG. 16, the first metal post 131 may protrude from the bottom surface of the first recess R1, but an example embodiment thereof is not limited thereto. At least one of the second to fourth metal posts 131, 132, 133, and 134 may be formed to protrude from the bottom surface of the second to fourth recesses R2, R3, and R4.

Figure 19:
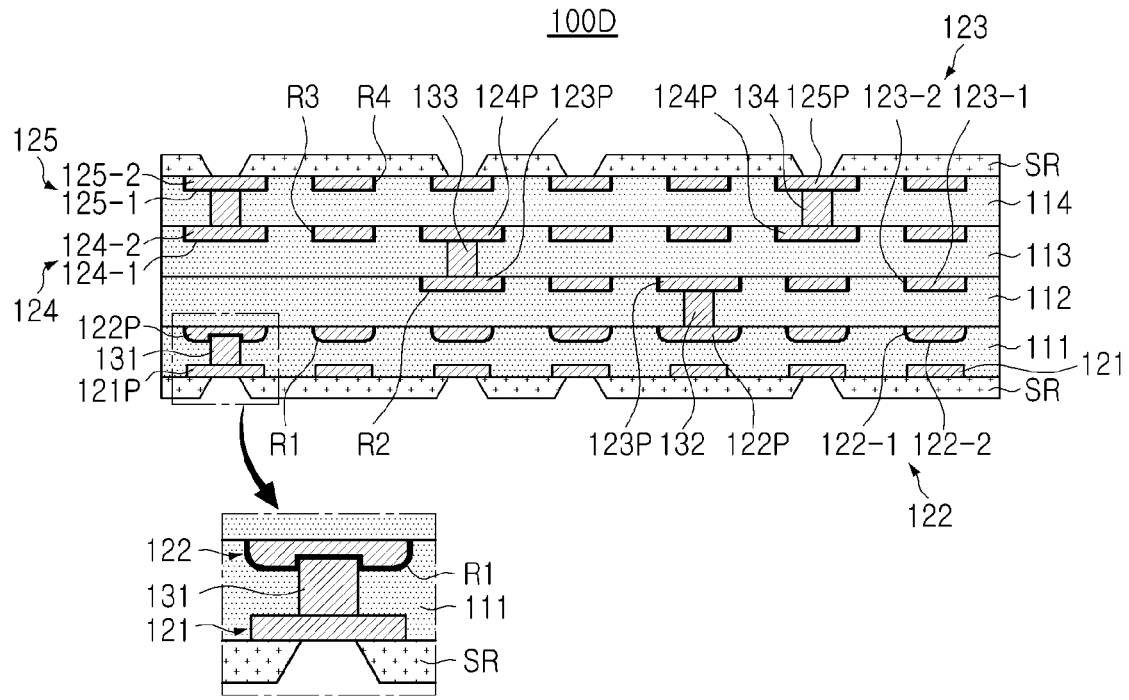
FIG. 19 is a cross-sectional diagram illustrating a printed circuit board according to a fourth example embodiment of the present disclosure.

FIG. 19 is a cross-sectional diagram illustrating a printed circuit board according to a fourth example embodiment.

Referring to FIGS. 15 and 19, in a printed circuit board 100D according to the fourth example embodiment, the shape of the post 131 may be different as compared to the printed circuit board 100B according to the second example embodiment. Therefore, in describing the example embodiment, only the first metal post 131 different from the metal post of the second example embodiment will be described. The description of the first example embodiment may be applied to the other elements of the example embodiment.

Referring to FIG. 19, one end (the upper region of the first metal post 131 with reference to FIG. 19) of the first metal post 131 may protrude from the bottom surface of the first recess R1. Also, a seed layer 122-1 of the second conductor-pattern layer 122 formed on the internal surface of the first recess R1 may be disposed on at least a portion of each of an upper surface of one end of the first metal post 131, a side surface of one end of the first metal post 131, and an internal surface of the first recess R1. For example, the seed layer 122-1 of the second conductor-pattern layer 122 may be configured as a conformal film to correspond to the shape of the surface formed by the upper surface of one end of the first metal post 131, the side surface of on end of the first metal post 131, and the internal surface of the first recess R1. Also, the seed layer 122-1 of the second conductor-pattern layer 122 may be continuously disposed along the upper surface of one end of the first metal post 131, the side surface of on end of the first metal post 131, and the internal surface of the first recess R1.

In the example embodiment, both the advantages of the printed circuit board 100B according to the second example embodiment and the advantages of the printed circuit board 100C according to the third example embodiment may be obtained. In other words, in the example embodiment, as in the second example embodiment, the first recess R1 may have a region having a reduced cross-sectional area, and the region having a reduced cross-sectional area may be disposed more adjacent to the first metal post 131 than the other region of the first recess R1, such that a plating defect of the second conductor-pattern layer 122 may be prevented. In other words, the internal wall of the first recess R1 may be inclined due to the reduced cross-sectional area, and due to the inclined region, the seed layer 122-1 of the second conductor-pattern layer 122 may be formed reliably on the internal wall of the first recess R1 due to the inclined region. Accordingly, a plating defect in which the second conductor-pattern layer 122 is not formed in the first recess R1 may be reduced. Also, in the example embodiment, as in the third example embodiment, one end of the first metal post 131 may protrude from the bottom surface of the first recess R1, such that one end of the first metal post 131 may be inserted into the second conductor-pattern layer 122. Accordingly, electrical and physical coupling reliability between the first metal post 131 and the second conductor-pattern layer 122 may improve.

In FIG. 19, the first metal post 131 may protrude from the bottom surface of the first recess R1, but an example embodiment thereof is not limited thereto. At least one of the second to fourth metal posts 131, 132, 133, and 134 may be formed to protrude from the bottom surface of the second to fourth recesses R2, R3, and R4.

Figure 20:
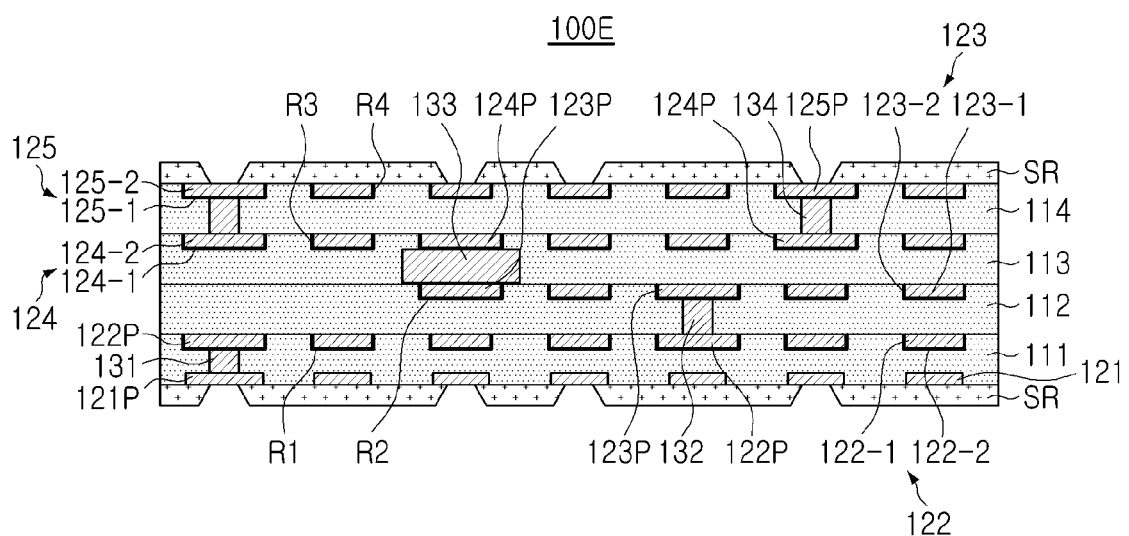
FIG. 20 is a cross-sectional diagram illustrating a printed circuit board according to a fifth example embodiment of the present disclosure.

FIG. 20 is a cross-sectional diagram illustrating a printed circuit board according to a fifth example embodiment.

Referring to FIGS. 3 and 20, in a printed circuit board 100E according to the fifth example embodiment, the shape of the third metal post 133 may be different as compared to the printed circuit board 100A according to the first example embodiment. Accordingly, in describing the example embodiment, only the third metal post 133 different from the metal post in the first example embodiment will be described. The description of the first example embodiment may be applied to the other elements of the example embodiment.

Referring to FIG. 20, the third and fourth conductor-pattern layers 123 and 124 may have third and fourth pads 123P and 124P in contact with the third metal post 133, and a diameter of the third metal post 133 may be configured to be greater than those of the third and fourth pads 123P and 124P. The third conductor-pattern layer 123 may include a seed layer 123-1 disposed on both side surfaces and a lower surface of the third conductor-pattern layer 123 and a seed pattern disposed between the upper surface of the third conductor-pattern layer 123 and the other end of the third metal post 133, to form a third metal post 133 having a relatively large diameter. Accordingly, the third pad 123P of the third conductor-pattern layer 123 may include the seed layer 123-1, the seed pattern, and the plating layer 123-2, and the plating layer 123-2 of the third pad 123P may have a shape in which overall four side surfaces may be covered due to the seed layer 123-1 and the seed pattern.

A general via and a general conductor-pattern layer may be formed by processing a via hole in the insulating layer and performing plating selectively on the surface of the insulating layer including the internal wall of the via hole. In the case of such a general process, pads disposed above and below the via hole may be configured to be greater than a diameter of the via hole for alignment during the processing of the via hole. Accordingly, there may be a limitation in reducing an average line width, an average space, and an average pitch of the conductor-pattern layer.

In the example embodiment, as described in the above-described embodiments, the third metal post 133 may be formed before the third insulating layer 113 and the third conductor-pattern layer 123 are formed. Also, a third recess R3 may be formed on one surface (the upper surface of the third insulating layer 113 with reference to FIG. 20) of the third insulating layer 113 to partition a region in which the third conductor-pattern layer 123 is formed. Accordingly, in the example embodiment, a process error in a general process considering a machining error of when forming a via hole may be excluded. Therefore, in the example embodiment, the diameter of the third metal post 133 may be configured to be greater than those of the third and fourth pads 123P and 124P, and accordingly, the cross-sectional area of the configuration of vertically connecting the third and fourth conductor-pattern layers 123 and 124 may improve, and physical and electrical coupling reliability between the third and fourth conductor-pattern layers 123 and 124 may improve.

In FIG. 20, the diameter of the third metal post 133 may be greater than those of the third and fourth pads 123P and 124P, but an example embodiment thereof is not limited thereto. At least one of the first, second, and fourth metal posts 131, 132, and 134, and at least one of pairs of the first to third pads 121P, 122P and 123P and the fifth pad 125p adjacent to each other may satisfy a relationship between the diameter of the third metal post 133 and each of the diameters of the third and fourth pads 123P and 124P. For example, a diameter of the first metal post 131 may be greater than diameters of the first and second pads 121P and 122P in contact with the first metal post 131.

The descriptions in the second to fourth example embodiments may also be applied to the example embodiment.

Figure 21:
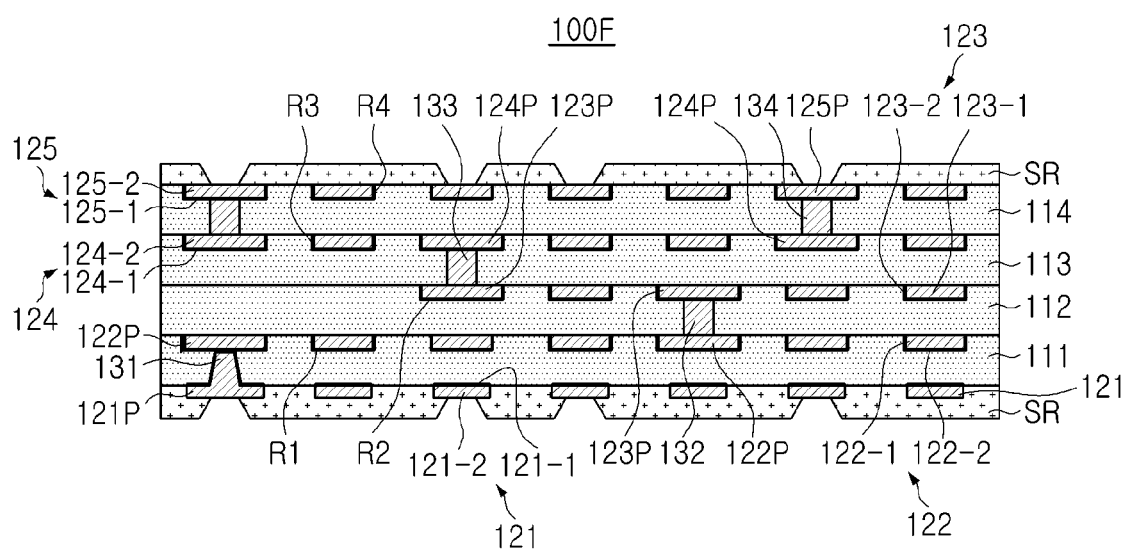
FIG. 21 is a cross-sectional diagram illustrating a printed circuit board according to a sixth example embodiment of the present disclosure.

FIG. 21 is a cross-sectional diagram illustrating a printed circuit board according to a sixth example embodiment.

Referring to FIGS. 3 and 21, in a printed circuit board 100F according to the sixth example embodiment, the first conductor-pattern layer 121 may be different as compared to the printed circuit board 100A according to the first example embodiment. Thus, in describing the example embodiment, only the first conductor-pattern layer 121 different from the conductor-pattern layer in the first example embodiment will be described. The description of the second and fourth example embodiments may be selectively applied to the example embodiment.

Referring to FIG. 21, the first conductor-pattern layer 121 may be disposed to protrude from one surface (the lower surface of the first insulating layer 111 with reference to FIG. 21) of the first insulating layer 111. In other words, in the example embodiment, differently from the first example embodiment, the first conductor-pattern layer 121 may be formed using a general building-up method using AP, SAP, MSAP, or the like. Accordingly, in the example embodiment, the first metal post 131 may have a general via structure, and the first conductor-pattern layer 121 may have a general SAP pattern. In other words, each of the first metal post 131 and the first conductor-pattern layer 121 may include a seed layer 121-1 and a plating layer 121-2.

According to the aforementioned example embodiments, a line width of a pattern of the conductor-pattern layer, a pitch between patterns, and a space between patterns may be reduced.

Also, damage and peeling of the conductor-pattern layer may be prevented during a process.

In the present disclosure, the terms "side portion," "side surface," and the like, may be used to refer to the left/right direction or a surface in that direction based on the drawing, and the terms "upper side," "upper portion," "upper surface," and the like, may be used to refer to the upward direction or a surface in that direction based on the drawing. The terms "lower side," "lower portion," "lower surface," and the like, may be used to refer to the downward direction or a surface in that direction based on the drawing. Also, the configuration in which an element is disposed on the side portion, the upper side, the upper portion, the lower side, or the lower portion may indicate that the element may be in direct contact with the other element in the corresponding direction, and also indicate that the element may be disposed in the corresponding direction but may not be in direct contact with the other element. However, the direction may be defined for ease of description, and the scope of the claims may not be particularly limited by the description of this direction, and the concept of upward/downward may be varied.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." The terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

An expression used in the singular encompasses the expression of the plural, unless it has a clearly different meaning in the context.

While the example embodiments have been illustrated and described above, it will be apparent to those skilled in the art that modifications and variations could be made without departing from the scope of the present disclosure as defined by the appended claims.

What is claimed is:

1. A printed circuit board, comprising:
   a first insulating layer;
   a first conductor-pattern layer disposed on a first surface of the first insulating layer;
   a first recess disposed in a second surface of the first insulating layer opposing the first surface of the first insulating layer;
   a second conductor-pattern layer disposed in the first recess;
   a first metal post penetrating the first insulating layer, connecting the first and second conductor-pattern layers to each other, and having one end exposed to a bottom surface of the first recess;
   a second insulating layer having one surface in contact with the second surface of the first insulating layer;
   a second recess disposed in another surface of the second insulating layer opposing the one surface of the second insulating layer;
   a third conductor-pattern layer disposed in the second recess;
   a second metal post penetrating the second insulating layer and connecting the second and third conductor-pattern layers to each other;
   a solder resist disposed on the second insulating layer and having an opening to expose a portion of the third conductor-pattern layer;
   a third insulating layer disposed on an opposing side of the first insulating layer with respect to the second insulating layer such that the first insulating layer is disposed between the second insulating layer and the third insulating layer;
   a fourth conductor-pattern layer disposed on a first surface of the third insulating layer;
   a third recess disposed in a second surface of the third insulating layer opposing the first surface of the third insulating layer;
   a fifth conductor-pattern layer disposed in the third recess; and
   a third metal post penetrating the third insulating layer, connecting the fourth and fifth conductor-pattern layers to each other, and having one end protruding from a bottom surface of the third recess towards the second insulating layer,
   wherein the first and second insulating layer have the same material, and
   wherein an upper surface of the first metal post does not extend in an upward direction beyond a lower surface of the second conductor-pattern layer disposed in the first recess.

2. The printed circuit board of claim 1, wherein, in the first insulating layer, a region in which the second conductor-pattern layer is disposed and a region in which the first metal post is disposed are integrated with each other.

3. The printed circuit board of claim 1, wherein a partial region of the fifth conductor-pattern layer has a cross-sectional area decreasing in a direction from the second surface of the third insulating layer toward the first surface of the third insulating layer.

4. The printed circuit board of claim 3, wherein the partial region of the fifth conductor-pattern layer is disposed more adjacent to the third metal post than the other region of the fifth conductor-pattern layer.

5. The printed circuit board of claim 3, wherein the one end of the third metal post protrudes from the bottom surface of the third recess.

6. The printed circuit board of claim 5, further comprising a seed layer disposed on at least a portion of each of an upper surface of the one end of the third metal post, a side surface of the one end of the third metal post, and an internal surface of the third recess.

7. The printed circuit board of claim 1, wherein the first conductor-pattern layer includes a first pad and the second conductor-pattern layer includes a second pad, wherein the first and second pads are in contact with the first metal post, and
   wherein a diameter of the first metal post is greater than a diameter of each of the first and second pads.

8. The printed circuit board of claim 7, wherein the first conductor-pattern layer includes a seed pattern disposed between the other end of the first metal post and the first pad.

9. The printed circuit board of claim 1, wherein the first conductor-pattern layer is disposed to protrude on the first surface of the first insulating layer.

10. The printed circuit board of claim 1, wherein the second conductor-pattern layer includes:
    a seed layer disposed on at least a portion of each of a surface of the one end of the first metal post exposed to the bottom surface of the first recess and an internal surface of the first recess including the bottom surface of the first recess; and
    a plating layer disposed on the seed layer to fill at least a portion of the first recess.

11. A printed circuit board, comprising:
    a first insulating layer;
    a first conductor-pattern layer disposed on a first surface of the first insulating layer;
    a first recess disposed in a second surface of the first insulating layer opposing the first surface of the first insulating layer;
    a second conductor-pattern layer disposed in the first recess;
    a first metal post penetrating the first insulating layer, connecting the first and second conductor-pattern layers to each other;
    a second insulating layer having one surface in contact with the second surface of the first insulating layer;
    a second recess disposed in another surface of the second insulating layer opposing the one surface of the second insulating layer;
    a third conductor-pattern layer disposed in the second recess;
    a second metal post penetrating the second insulating layer and connecting the second and third conductor-pattern layers to each other;
    a solder resist disposed on the second insulating layer and having an opening to expose a portion of the third conductor-pattern layer;
    a third insulating layer disposed on an opposing side of the first insulating layer with respect to the second insulating layer such that the first insulating layer is disposed between the second insulating layer and the third insulating layer;

a fourth conductor-pattern layer disposed on a first surface of the third insulating layer;

a third recess disposed in a second surface of the third insulating layer opposing the first surface of the third insulating layer;

a fifth conductor-pattern layer disposed in the third recess; and a third metal post penetrating the third insulating layer, connecting the fourth and fifth conductor-pattern layers to each other, and having one end protruding from a bottom surface of the third recess towards the second insulating layer, wherein a side surface of the first metal post is only in contact with the first insulating layer, and wherein the first and second insulating layer have the same material.

12. The printed circuit board of claim 11, wherein the second conductor-pattern layer includes:

a seed layer disposed on at least a portion of each of a surface of the one end of the first metal post and an internal surface of the first recess including the bottom surface of the first recess.

13. The printed circuit board of claim 12, wherein the seed layer is disposed on at least a portion of each of an upper surface of the one end of the first metal post, and the internal surface of the first recess.

14. The printed circuit board of claim 11, wherein a partial region of the fifth conductor-pattern layer has a cross-sectional area decreasing in a direction from the second surface of the third insulating layer toward the first surface of the third insulating layer.

15. The printed circuit board of claim 14, wherein the partial region of the fifth conductor-pattern layer is disposed more adjacent to the third metal post than the other region of the fifth conductor-pattern layer.

16. The printed circuit board of claim 11, wherein, in the first insulating layer, a region in which the second conductor-pattern layer is disposed and a region in which the first metal post is disposed are integrated with each other.

17. The printed circuit board of claim 11, wherein the first conductor-pattern layer includes a first pad and the second conductor-pattern layer includes a second pad, wherein the first and second pads are in contact with the first metal post, and wherein a diameter of the first metal post is greater than a diameter of each of the first and second pads.

18. The printed circuit board of claim 17, wherein the first conductor-pattern layer includes a seed pattern disposed between the other end of the first metal post and the first pad.

* * * * *